United States Patent [19]

Koyama et al.

[11] Patent Number: 5,374,332
[45] Date of Patent: Dec. 20, 1994

[54] METHOD FOR ETCHING SILICON COMPOUND FILM AND PROCESS FOR FORMING ARTICLE BY UTILIZING THE METHOD

[75] Inventors: Shuji Koyama, Kawasaki; Masami Kasamoto, Ayase; Makoto Shibata, Yokohama, all of Japan

[73] Assignee: Canon Kabushiki Kaisha, Tokyo, Japan

[21] Appl. No.: 836,710

[22] Filed: Feb. 19, 1992

[30] Foreign Application Priority Data

Feb. 20, 1991 [JP] Japan .................................. 3-045578
Feb. 14, 1992 [JP] Japan .................................. 4-059117

[51] Int. Cl.$^5$ .......................................... H01L 21/306
[52] U.S. Cl. ................................... 156/643; 156/646; 156/630; 156/653
[58] Field of Search ...................... 156/643; 346/140 R, 346/655

[56] References Cited

U.S. PATENT DOCUMENTS

| | | | |
|---|---|---|---|
| 4,563,367 | 1/1986 | Sherman | 156/643 |
| 4,758,305 | 7/1988 | Bonifield et al. | 156/643 |
| 4,889,587 | 12/1989 | Komuro | 156/643 |
| 4,968,992 | 11/1990 | Komuro | 346/140 R |
| 5,254,213 | 10/1993 | Tamaki | 156/655 |

FOREIGN PATENT DOCUMENTS

0258606 8/1986 European Pat. Off.

OTHER PUBLICATIONS

S. J. Yun et al., "Characterization of Silicon Surface Contamination and Near-Surface Damage caused by $C_2F_6/CHF_3$ RIE", J. Electrochem. Soc., vol. 137, No. 8, Aug. 1990, pp. 2634–2639.
R. N. Castellano, "Profile Control in Plasma Etching of $SiO_2$", Solid State Technology, vol. 27, No. 5, May 1984, pp. 203–206.
P. E. Riley et al; "Examination of Flourocarbon–Based Plasma Used in the Selective . . . ", J. Vac. Sci. Technol. B, vol. 7. No. 1, Jan./Feb. 1989, pp. 24–34.
Ch. Cardinaud et al., "Analyse XPS des surfaces de Si et $SiO_2$ Eyposées aux Plasmas . . . ", Revue Phys. Appl. vol. 24, 1989 pp. 309–321.
J. H. Thomas III et al., "The Effects of Polymer Film Formation on Photoresist During . . . ", Vac. Sci. Technol.,A. vol. 8, No. 3, May/Jun. 1990, pp. 1706–1711.
Riley, P. E. et al., "Development of a Multistep $SiO_2$ Plasma Etching Process in a Minibatch Reactor Using Response–Surface Methodology", J. Electrochem. Soc., vol. 136, No. 4, 1112–1119, Apr. 1989.
Peccoud, L. et al., "New trends and limits in plasma etching", J. Phys. D: Appl. Phys. 20, No. 7, 851–857, Jul. 14, 1987.
Riley, P. E. et al., "Reactor Characterization for an $SiO_2$ Plasma Etchback Process With Response–Surface Methodology: Effects of Interelectrode Spacing", J. Electrochem. Soc. vol. 137, No. 7, 2227–2231, Jul. 1990.
Peccoud, L. et al., "Polymer Formation and Reactor Cleaning During Silicon Oxide Etching", Extended Abstracts, vol. 83–1, No. 116, May 1983.

*Primary Examiner*—Brian E. Hearn
*Assistant Examiner*—Trung Dang
*Attorney, Agent, or Firm*—Fitzpatrick, Cella, Harper & Scinto

[57] ABSTRACT

A method for etching a silicon compound film comprises etching the silicon compound film in a gas flow rate ratio of $CHF_3$ to $C_2F_6$ of 1 to 6 under etching pressure of 40 to 120 Pa.

19 Claims, 9 Drawing Sheets

F I G. 1
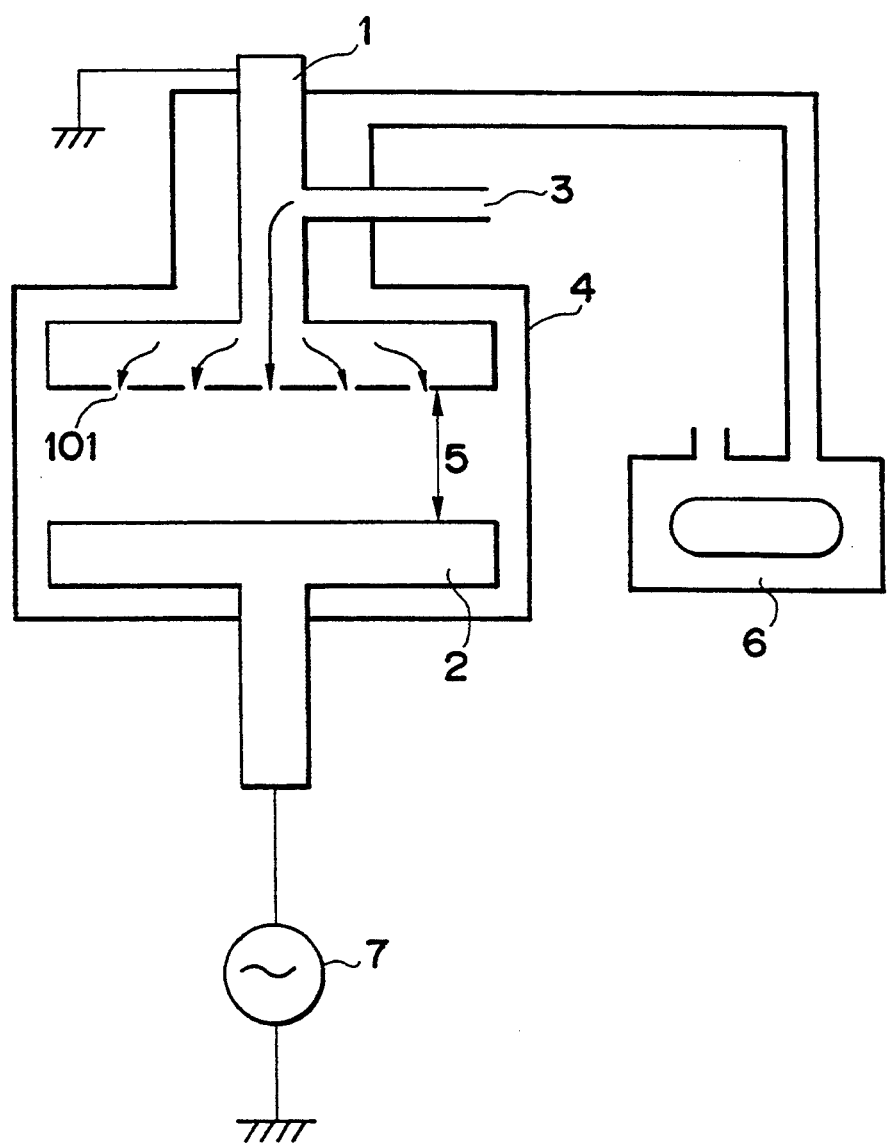

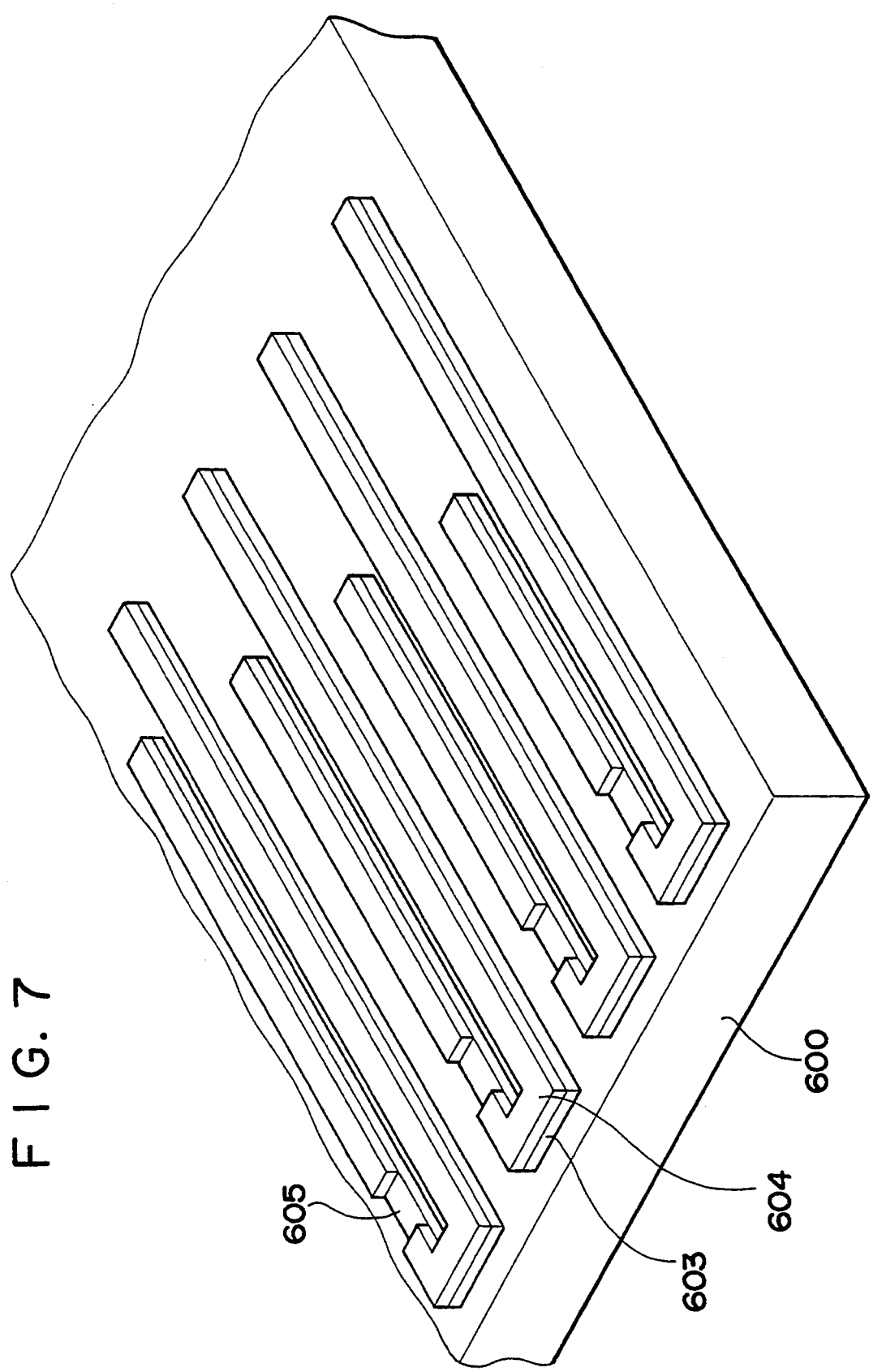

METHOD FOR ETCHING SILICON COMPOUND FILM AND PROCESS FOR FORMING ARTICLE BY UTILIZING THE METHOD

BACKGROUND OF THE INVENTION

1. Field of the Invention

The present invention relates to a method for etching a silicon compound film and a process for forming an article, utilizing the method, and more particularly to a method for etching a film of silicon oxide, silicon nitride or silicon carbide suitable for the preparation of semiconductor devices such as integrated circuits, etc., wiring circuit boards, and recording head heater substrates for use in the recording system for recording utilizing heat energy, and a process for forming an article, utilizing the method.

2. Related Background Art

In the field of articles such as semiconductor devices such as integrated circuits, etc., wiring circuit boards or recording head heater substrates, it is an ordinary practice to utilize a multilayer wiring technique in the preparation of smaller and more precise articles such as semiconductor devices, wiring circuit boards and heater substrates.

According to the multilayer wiring technique, a lower wiring and an upper wiring are usually provided, and in order to keep an electrical insulation between these wirings, an insulating layer is provided between these wirings.

Silicon oxide, typically $SiO_2$, silicon nitride, typically $Si_3N_4$ and silicon carbide, typically SiC, are widely used as an insulating layer or a protective layer between the upper wiring and the lower wiring. Above all, silicon compounds such as silicon oxide, silicon nitride, silicon carbide, etc. are suitable not only for the process for preparing the abovementioned articles, but also for a protective layer from the viewpoint of thermal and chemical stability and thus are widely utilized.

The layer of silicon compound as mentioned above is etched, when required, to make throughholes, etc. and in order to meet an increasing demand for etching with more precise and dense pattern, a most suitable dry etching method is now desired.

As etching gases for dry etching of films or silicon compounds such as silicon oxide (hereinafter referred to as $SiO_2$), silicon nitride (hereinafter referred to as $Si_3N_4$), or silicon carbide (hereinafter referred to as SiC), fluorohydrocarbon gases such as $CF_4$, $CF_4+H_2$, $C_2F_6$, $C_3F_8$, $CHF_3$, etc. are known. Above all, a mixed gas of $CHF_3+C_2F_6$ has a higher etching rate and a wide range for selection ratio of positive resist and Si, and is most suitable for etching of a silicon compound film. Particularly for a $SiO_2$ film, a good etching uniformity can be obtained in a gas flow rate ratio ($CHF_3/C_2F_6$) ranging from 0.1 to 0.9. This condition is also applied to etching of other silicon compounds and widely utilized in the preparation of semiconductor devices. That is, when etching is carried out in an etching gas atmosphere, where $C_2F_6$ is more than $CHF_3$, a good etching uniformity can be obtained at a commercially satisfactory etching rate.

However, it has been found that, in the etching of a silicon compound film with a mixed gas of $CHF_3+C_2F_6$ and containing more $C_2F_6$, and in the case that the underlayer is Al or Al-containing alloy, e.g. Al-Si, Al-Si-Cu, etc., reaction products of Al deposit, for example, at contact holes, giving the following adverse effects on the devices:

(1) The deposited reaction products of Al weaken adhesion to an upper layer to be formed successively thereon, giving often defects to the semiconductor devices.

(2) In case of a multilayer film, the deposited reaction products of Al sometimes form unevenness in the film, giving defects to the semiconductor devices.

(3) The deposited reaction products of Al, for example aluminum fluoride, sometimes lower the insulation between the adjacent electrodes, generating an interelectrode leakage.

(4) When the mixed gas is used in the process for preparing a recording head heater substrate of such a type as to utilize heat energy to change a liquid state and eject the liquid by the state change, the deposited reaction products of Al on the heat-working surface of the heater substrate sometimes deteriorate the thermal uniformity of the heat-working surface, causing fluctuations in the generation of bubbles in the liquid to deteriorate the liquid ejection stability.

In case of etching a silicon compound film with a mixed gas of $CHF_3$ and $C_2F_6$ and containing more $CHF_3$, it is possible to suppress formation of reaction products of Al such as aluminum fluoride, etc. in contrast to the case of $C_2F_6$-rich mixed gas. However, a polymerization film of $CF_2$ monomers is more readily formed in that case, and another problem such as lowering of etching rate, etc. is sometimes encountered.

Thus, a commercially applicable new etching method capable of solving the foregoing problems has been desired for etching a silicon compound film with a mixed gas of $CHF_3$ and $C_2F_6$.

SUMMARY OF THE INVENTION

An object of the present invention is to provide a method for etching a silicon compound film suitable for solving the afore-mentioned problems and for commercial application, and a process for preparing an article, utilizing the method.

The present invention provides a method for etching a silicon compound film in a wide range of selection ratio of silicon compound, Si, resist, etc. at a high etching rate of silicon compound, which can solve the problems such as deposition of reaction products of Al or formation of a polymerization film, as mentioned above, and a process for forming an article, utilizing the method.

BRIEF DESCRIPTION OF THE DRAWINGS

FIG. 1 is a schematic cross-sectional view of an etching apparatus for use in the present invention.

FIG. 7 is a schematic perspective view of a heater substrate in the course of preparation.

DETAILED DESCRIPTION OF THE PREFERRED EMBODIMENTS

Figure 2:
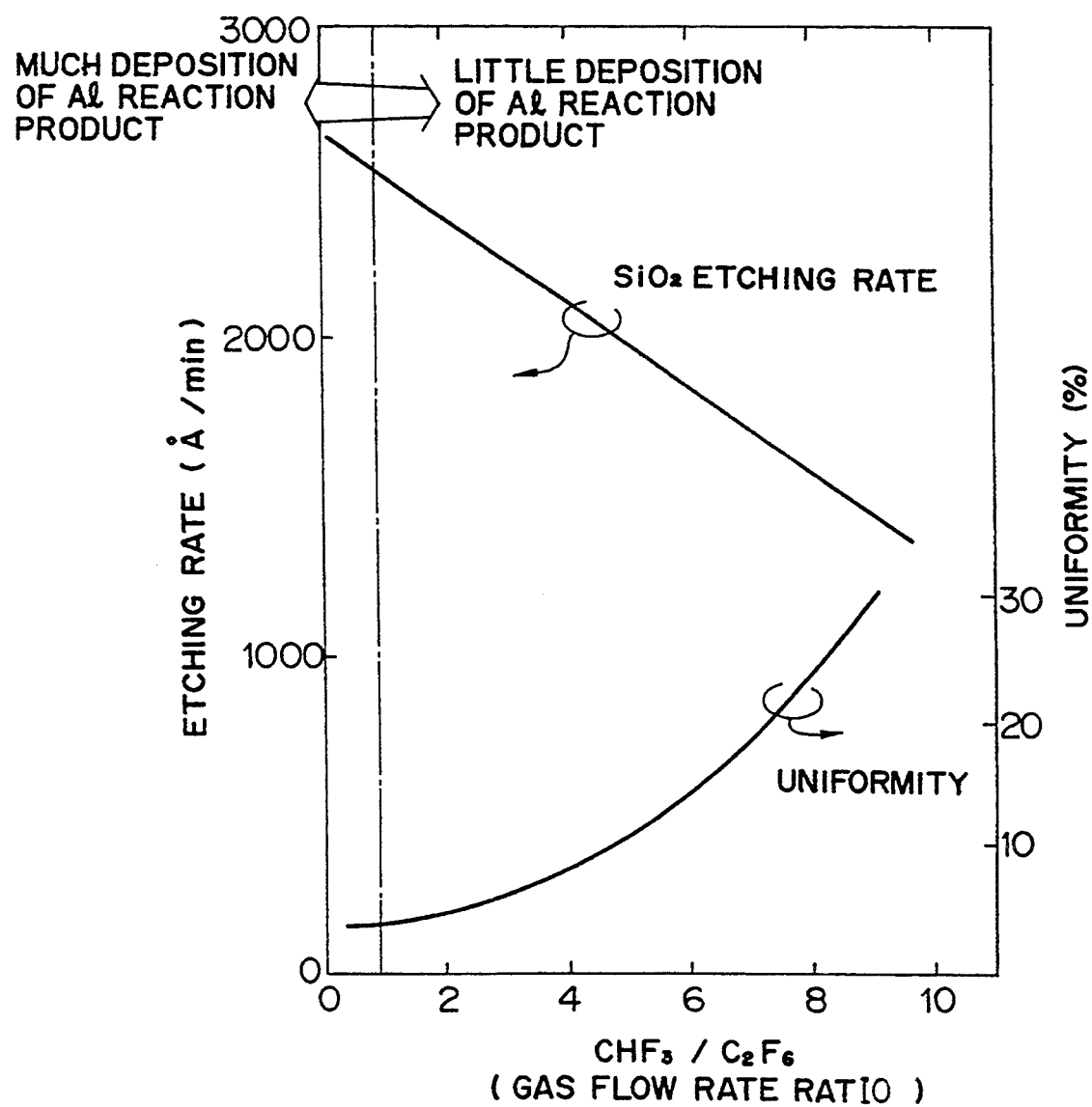
FIG. 2 is a diagram showing correlations between a gas flow rate ratio ($CHF_3/C_2F_6$) and a $SiO_2$ etching rate, an etching uniformity or an amount of deposited reaction products of Al determined by SEM.

The above objects of the present invention can be accomplished by effecting dry etching under such conditions as a gas flow rate ratio of $CHF_3$ gas to $C_2F_6$ gas to be introduced into an etching space, ($CHF_3/C_2F_6$) of 1 to 6 and a pressure of 40 to 120 Pa in the etching space during the etching.

Further, the above objects can be more effectively accomplished by carrying out the dry etching under the above mentioned conditions and an additional condition of the interelectrode distance of 4.0–7.0 mm between a cathode and an anode in the etching space.

A gas flow rate ratio of $CHF_3$ gas to $C_2F_6$ gas is a ratio of $CHF_3$ gas to $C_2F_6$ gas to be each introduced into the etching space. When a $CHF_3$ gas or a $C_2F_6$ gas is introduced into the etching space after dilution with an inert gas such as a He gas, etc. or a $H_2$ gas, the gas flow rate ratio must be the one obtained upon conversion of the diluted gas flow rates to flow rates of substantially 100% $CHF_3$ gas and $C_2F_6$ gas, respectively, according to degree of dilution.

It is more preferable to use such etching conditions as a gas flow rate ratio of $CHF_3$ gas to $C_2F_6$ gas ($CHF_3/C_2F_6$) of 3 to 6, an interelectrode distance of 4.0 to 6.0 mm between the cathode and the anode, and a pressure of 40 to 100 Pa.

In the present dry etching method, a reactive ion etching apparatus, a plasma etching apparatus, etc. can be used.

The present invention will be described in detail below, referring to the drawings.

FIG. 1 is a schematic cross-sectional view of an etching apparatus for use in the present invention, where numeral 1 is an anode, 2 a cathode, 3 a gas inlet, 4 a vacuum chamber as an etching space, 5 an interelectrode distance, 6 a vacuum pump and 7 a high frequency power source.

The anode 1 is provided with openings 101 for gas discharge, and the gas introduced through the gas inlet 3 is discharged into the vacuum chamber 4 through the openings 101. The high frequency power source 7 is electrically connected at one end to the cathode 2, and the other end of the high frequency power source 7 is grounded. The anode 1 is also grounded. By driving the vacuum pump 6, the vacuum chamber 4 is brought to a desired pressure, and a desired gas is introduced into the vacuum chamber 4 through the gas inlet 3 in that state, and the high frequency power source 7 is turned on, whereby the gas introduced into the vacuum chamber 4 through the openings 101 is converted to plasma. When an article to be etched is placed on the cathode 2 at that time, the article can be etched.

In the foregoing embodiment, the openings 101 are provided at anode 1, but it is not essential to discharge the gas into the vacuum chamber 4 from the anode 1. However, more uniform etching can be carried out by discharging the gas as uniformly as possible to an article to be etched, and thus it is preferable to provide openings at the anode 1, that is, the opposite side of an electrode to an article to be etched, which is placed on another electrode.

The present invention will be explained in detail below, referring to a method for etching d typical $SiO_2$ film.

In the present invention, a laminate comprising a substrate of silicon or glass, an Al film and a $SiO_2$ film, successively laid one upon another, is placed on the cathode 2 as an article to be etched. Then, the vacuum chamber 4 is evacuated to a vacuum degree of 10 Pa or less by the vacuum pump 6 and then a mixed gas of $CHF_3+C_2F_6$ is introduced into the vacuum chamber 4 through the gas inlet 3 as the reactive gas. Then, the vacuum chamber 4 is kept under a desired pressure. The introduced mixed gas of $CHF_3+C_2F_6$ is adjusted to a gas flow rate ratio of $CHF_3$ to $C_2F_6$ of 1 to 6.

In the present invention, a high frequency power is applied between the cathode 2 and the anode 3 from the high frequency power source 7 in that state to generate plasma and conduct etching of $SiO_2$.

In the present invention, an inlet gas rate and/or a pump evacuation rate is controlled to maintain the pressure in the vacuum chamber 4 at 40 to 120 Pa during the etching.

The mixed gas to be introduced into the vacuum chamber 4 can be prepared by mixing a $CHF_3$ gas with a $C_2F_6$ gas before the introduction into the vacuum chamber 4 or mixing the $CHF_3$ gas with the $C_2F_6$ gas in the vacuum chamber 4 or through the conduit to the gas inlet 3.

In the present invention, the interelectrode distance 5 between the anode 1 and the cathode 2 is in a range of 4.0 to 7.0 mm.

When a gas flow rate ratio ($CHF_3/C_2F_6$) is 0.1 to 0.9 during the etching, reaction products of Al such as $AlF_3$, etc. deposit around the $SiO_2$ etched portion. In the present invention, deposition of reaction products of Al can be made less by setting a gas flow rate ratio, an interelectrode distance 5 and a pressure in the vacuum chamber 4 to specific ranges, respectively, as described above.

In the present invention, a flow rate of $CHF_3$ gas is made equal or superior to that of $C_2F_6$ gas, but no polymerization film of $CF_2$ monomers is formed because the pressure (etching pressure) and the interelectrode distance are set to the optimum, respectively, during the etching, and thus very efficient and satisfactory etching can be carried out.

In the present invention, the power applied between the electrodes depends on such conditions as area of an article to be etched, shapes of the etching apparatus, etc. and thus cannot be specified, but it is desirable to set it to 150 to 500 W, preferably to 200 to 400 W.

Since the electrodes are heated, for example, by plasma discharge during the etching, it is preferable in the present invention to provide a cooling means at the electrodes to prevent unnecessary etching of the electrodes or fluctuations of etching conditions, thereby assuring uniform etching.

Grounds for the specific ranges of the etching conditions in the present invention will be explained below, referring to FIGS. 2 to 4.

FIG. 2 is a diagram showing correlations between a gas flow rate ratio ($CHF_3/C_2F_6$) on the axis of the abscissa and a $SiO_2$ etching rate, an etching uniformity, or an amount of deposited reaction products of Al, determined by SEM on the axis of the ordinate. It is apparent from FIG. 2 that in an increasing gas flow rate Patio (CHF$_3$/ C$_2$F$_6$) the SiO$_2$ etching rate is decreased and the etching uniformity is deteriorated, but the amount of deposited reaction products of Al is decreased, where the total flow volume of (CHF$_3$+C$_2$F$_6$) is 40 SCCM, the high frequency (RF) power is 250 W, the interelectrode distance is 5 mm and the etching pressure is 80 Pa.

Figure 3:
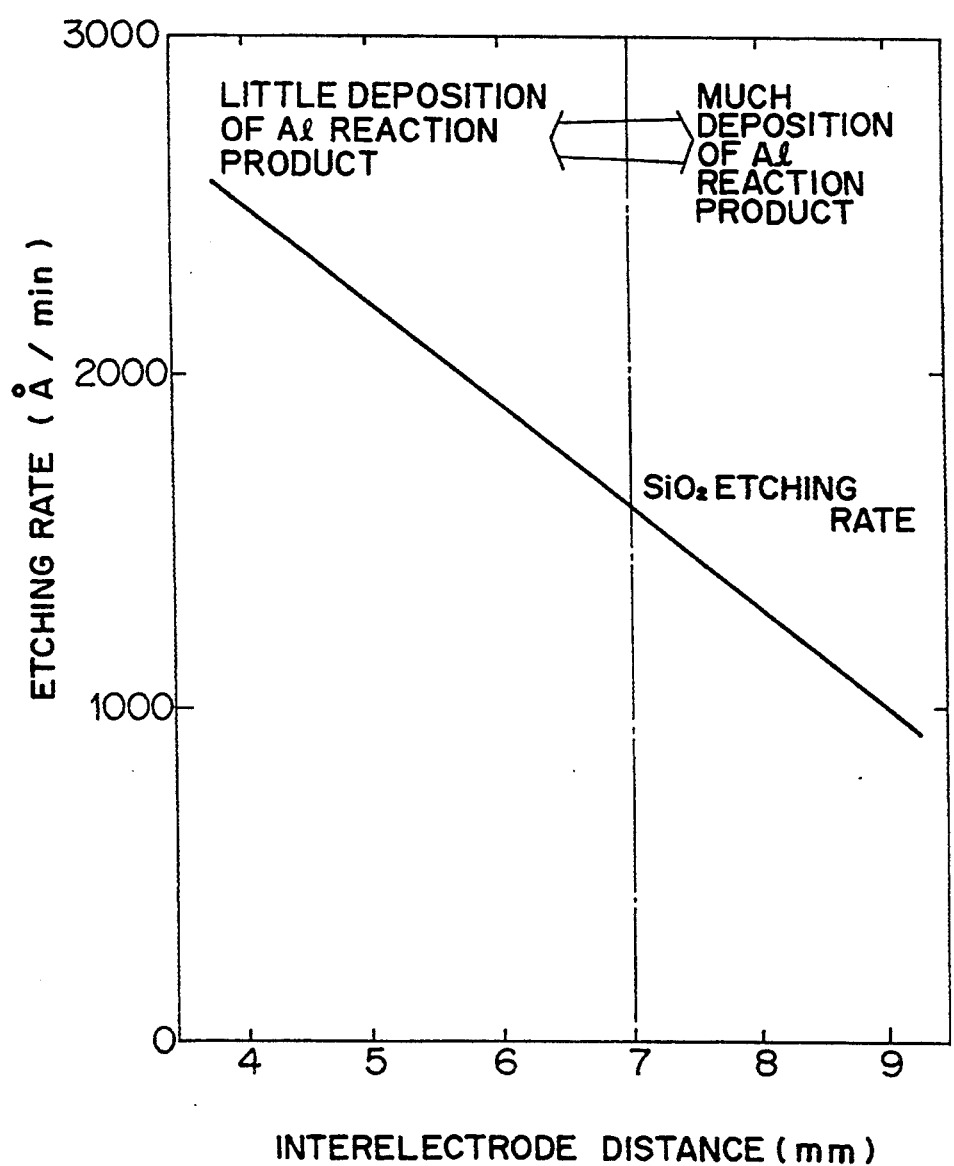
FIG. 3 is a diagram showing correlations between an interelectrode distance and a $SiO_2$ etching rate, or an amount of deposited reaction products of Al, determined by SEM.

FIG. 3 is a diagram showing correlations between an interelectrode distance on the axis of the abscissa and a SiO$_2$ etching rate or an amount of deposited reaction products of Al, determined by SEM on the axis of the ordinate. It is apparent from FIG. 3 that with a smaller interelectrode distance the SiO$_2$ etching rate is higher and the amount of deposited reaction products of Al is smaller, where the high frequency (RF) power is 250 W, the gas flow rate ratio (CHF$_3$/C$_2$F$_6$) is 4 and the etching pressure is 80 Pa.

Figure 4:
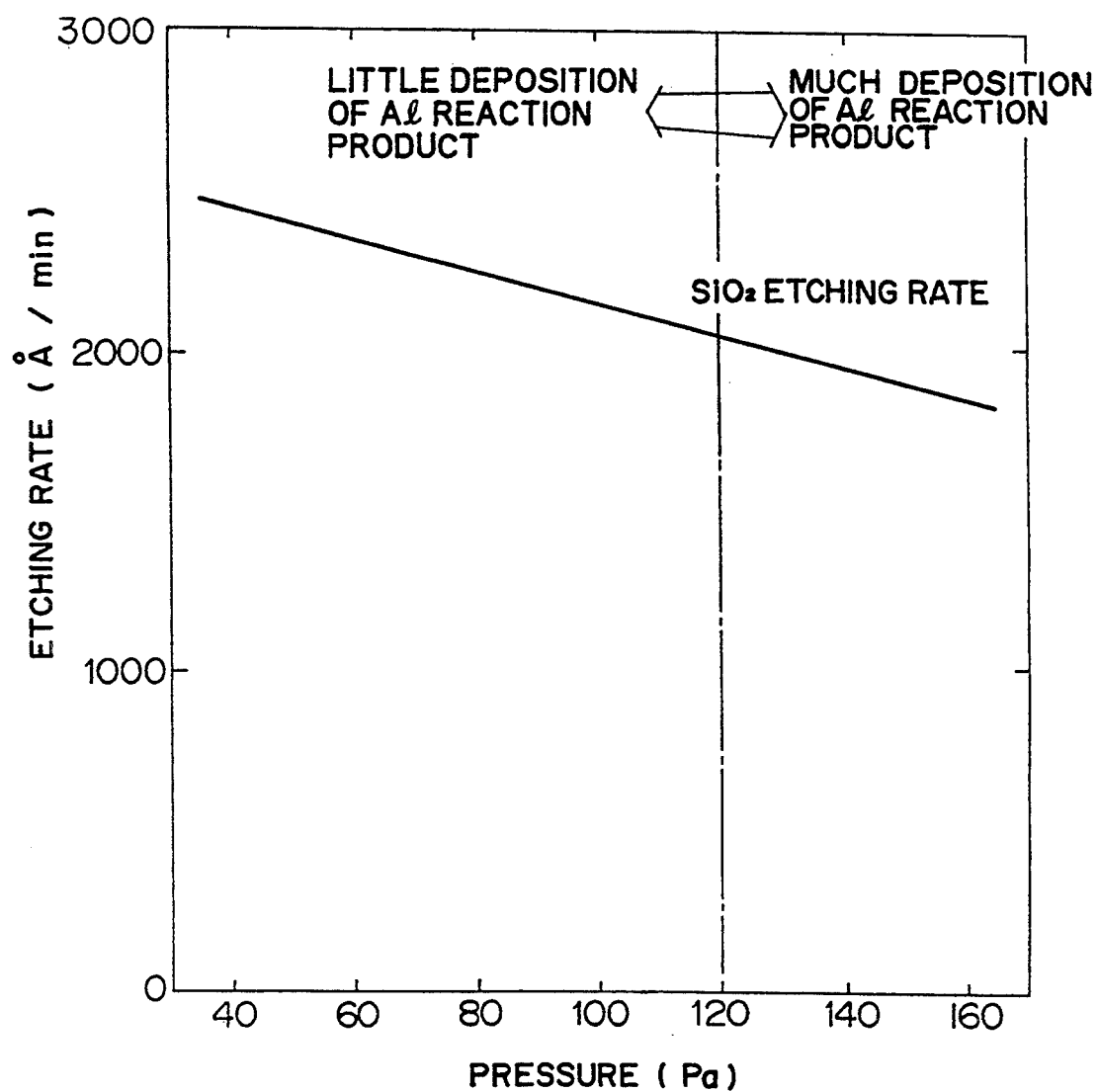
FIG. 4 is a diagram showing correlations between a pressure and a $SiO_2$ etching rate or an amount or deposited reaction products of Al, determined by SEM.

FIG. 4 is a diagram showing correlations between an etching pressure on the axis of the abscissa and a SiO$_2$ etching rate or an amount of reaction products of Al, determined by SEM on the axis of the ordinate. It is apparent from FIG. 4 that the lower the etching pressure, in other words, the higher the vacuum degree, the higher the SiO$_2$ etching rate is and the smaller the amount of deposited reaction product of Al is, where the high frequency (RF) power is 250 W, the gas flow rate ratio (CHF$_3$/C$_2$F$_6$) is 4 and the interelectrode distance is 5 min.

As is apparent from FIGS. 2 to 4, the gas flow rate ratio of CHF$_3$ gas to C$_2$F$_6$ gas, the etching pressure and the interelectrode distance have an important influence on the amount of deposited reaction products of Al, the SiO$_2$ etching rate and the etching uniformity.

As a result of extensive tests and studies on the individual factors giving such important influences, the present inventor has found that a distinguished etching effect can be obtained by setting the individual factors to specific ranges as mentioned above, and particularly that the deposition of reaction products of Al can be effectively reduced by setting a gas flow rate ratio to 1.0 or more, an interelectrode distance to 7 mm or less, and an etching pressure to 120 Pa or less, and further that deposition of polymers can be effectively prevented by setting a gas flow rate ratio to 6.0 or less, uniform etching is conducted over the entire surface of an article to be etched by setting an interelectrode distance to 4.0 mm or more, and plasma can be generated and uniform etching can be conducted over the entire surface of an article to be etched by setting an etching pressure to 40 Pa or more.

As a result of overall review of these results, the present inventor has found that the method for etching can have very stable and uniform etching over the entire surface of an article to be etched as a synergistic effect by setting the individual factors to specific ranges as mentioned above, even if only one of the factors meets the corresponding specific range as mentioned above.

In the present invention etching can be conducted by keeping a gas flow rate ratio (CHF$_3$+C$_2$F$_6$) at 0.1 to 0.9 just before the Al or Al alloy under the silicon compound film such as a SiO$_2$ film is exposed to, thereby etching the silicon compound film such as a SiO$_2$ film, and changing the gas flow rate ratio to 1 to 6 thereafter.

In this manner, a portion of the SiO$_2$ film (portion before the underlayer Al or Al alloy is exposed) can be etched with good uniform etching at a higher etching rate, though there is much deposition of reaction products of Al, and then the present etching method can be carried out, whereby very satisfactory etching can be carried out without deposition of reaction products of Al, even if the Al or Al alloy surface is exposed.

In the present invention, deposition of reaction products of Al can be suppressed around the etched portion by conducting dry etching of a silicon oxide film under such conditions as a gas flow rate ratio (CHF$_3$/C$_2$F$_6$) of 1 to 6, an interelectrode distance of 4.0 to 7.0 mm between the anode and the cathode, and an etching pressure of 40 to 120 Pa, and thus adhesion to the upper layer can be improved without less defects and production percentage of unsatisfactory heater substrates, semiconductor devices, etc. can be reduced.

In the present invention, etching of a silicon compound film is carried out under the above-mentioned conditions. In order to generate stable plasma, it is desirable to use rather higher etching pressure in the initial period of etching to generate plasma, and then gradually lower the etching pressure. In that case, it is preferable to make plasma generation easier by making the pressure higher at the initial generation of plasma than that of the above-mentioned condition.

As silicon compounds for use in the present invention, silicon oxide, silicon nitride and silicon carbide are so far exemplified, but the present invention is not always limited only to these materials. In the present invention, any silicon compound susceptile to satisfactory etching under the above-mentioned conditions can be used as materials to be etched. Above all, it is most effective to apply the present invention to compounds of silicon and at least one element selected from the group consisting of oxygen, nitrogen and carbon, where the above-mentioned silicon oxide, silicon nitride and silicon carbide are most suitable materials to be etched.

The present invention will be explained in detail below, referring to Examples which are not limitative of the present invention.

EXAMPLE 1

FIGS. 5A to 5E shows steps of forming a contact hole using a SiO$_2$ thin film and successive steps of connecting a first Al thin film layer (electrode) to a second Al thin film layer (electrode) in the preparation of a heater substrate or an integrated circuit according to one embodiment of the present invention.

In FIGS. 5A to 5E, numeral 8 is an insulating layer, 9 is a first Al thin film layer, 10 is a SiO$_2$ film, 11 is an OFPR-800 photoresist (a product made by Tokyo Oka K. K., Japan), and 12 a second Al thin film layer.

Steps of forming a contact hole and connecting an electrode to another will be explained below.

Figure 5A:
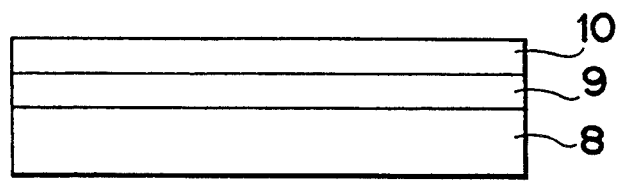
FIGS. 5A to 5E are schematic cross-sectional views for explaining one embodiment of preparing a contact hole, utilizing the present etching method.
Figure 5B:
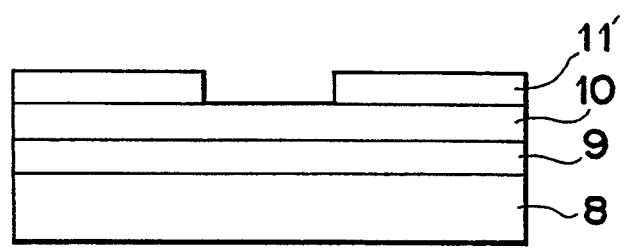
Figure 5C:
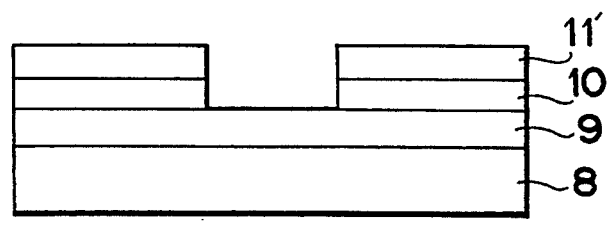
Figure 5D:
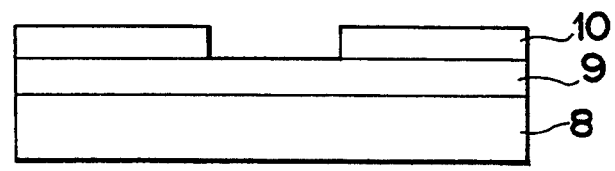

A first Al thin film layer 9 and a SiO$_2$ film 10 are successively formed one upon another on an insulating layer 8 by sputtering or the like (step A: FIG. 5A). Then, a photoresist 11 is applied to the SiO$_2$ film 10, and then exposed to light and developed to make patterning in a desired shape (Step B: FIG. 5B). Then, the SiO$_2$ film 10 is etched with a mixed gas of CHF$_3$+C$_2$F$_6$ by the present etching method while using the patterned resist 11' as a mask, thereby making a contact hole (Step C: FIG. 5C), where the etching conditions are a high frequency (RF) power of 250 W, a gas flow rate ratio of 4, an interelectrode distance of 5 mm and an etching pressure of 80 Pa. Then, the remaining resist 11' is removed by ashing (Step D: FIG. 5D).

Figure 5E:
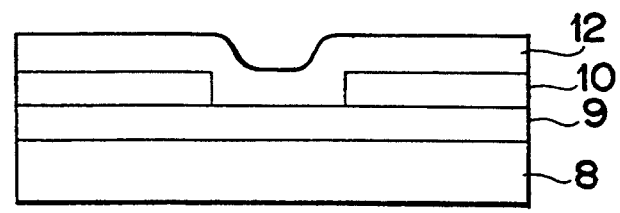

Finally, a second Al thin film layer 12 formed thereon by sputtering, thereby completing connection between the first Al film layer (electrode) 9 and the second Al film layer (electrode) 12 (step E: FIG. 5E).

A multi-layer wiring pattern can be formed by patterning the second Al thin film layer 12 in desired pattern by photolithography, if desired.

In step C, the $SiO_2$ thin film 10 is etched at an etching rate of about 2,000 Å/min. and deposition of reaction products of Al is investigated by SEM. No reaction products of Al are found at all, and uniform etching is obtained without any problems so far mentioned.

EXAMPLE 2

Etching is carried out in the same manner as in Example 1 except that gases such as He, $O_2$, etc. are further added to the mixed gas of $CHF_3+C_2F_6$, whereby the $SiO_2$ film can be etched as effectively as in Example 1.

When $CHF_3$ gas and $C_2F_6$ gas as diluted with He are introduced into the etching space, good etching can be obtained likewise.

EXAMPLE 3

The same article as used in Example 1 is etched stagewise, i.e. at two stages. At the first stage uniform etching of high $SiO_2$ etching rate is carried out in a gas flow rate ratio ($CHF_3/C_2F_6$) of 0.1 to 0.9 and at the second stage etching with less deposition of reaction products of Al is carried out under the same conditions as in Example 1. It is found that the $SiO_2$ film can be etched as effectively as in Example 1.

EXAMPLE 4

Etching is carried out in the same manner as in Example 1, except that the first Al thin film layer (electrode) 9 is replaced with an Al alloy thin film. It is found that the $SiO_2$ film can be etched as effectively as in Example 1.

EXAMPLE 5

An ink jet head heater substrate of such a type as to discharge a liquid by heat energy is prepared by utilizing the present etching method. Then, an ink jet head using the heater substrate is prepared and its head characteristics are investigated.

Process for preparing an ink jet head will be explained below, referring to FIGS. 6A to 6I.

Figure 6A:
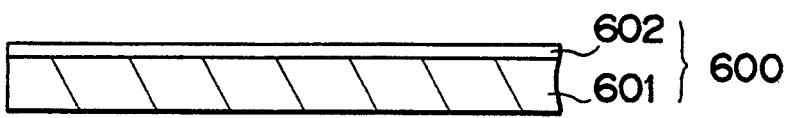
FIGS. 6A to 6I are schematic cross-sectional views for explaining steps of preparing an ink jet head, utilizing the present etching method.
Figure 6B:
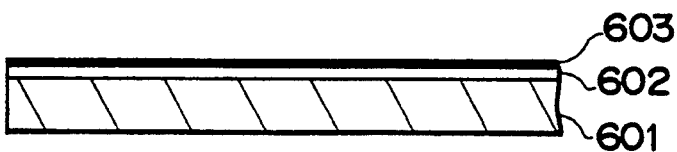
Figure 6C:
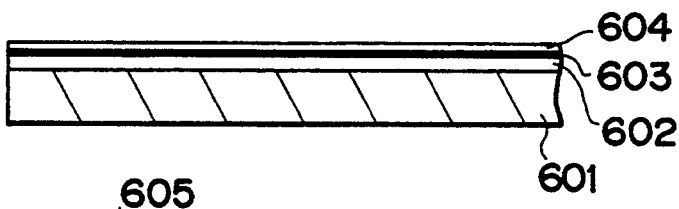
Figure 6D:

A base 600 comprising a Si substrate 601 and a $SiO_2$ layer 602 as an insulating layer, laid thereon, is prepared (FIG. 6A), and then a $HfB_2$ layer 603 as a resistor layer is formed on the $SiO_2$ layer 602 of the base 600 (FIG. 6B). Then, an Al layer 604 as a conductive metallic material is formed on the $HfB_2$ layer 603 (FIG. 6C). The formed Al layer 604 and $HfB_2$ layer 603 are etched in a desired pattern, by photolithography and then the Al layer is partially removed by etching to form a desired recess 605 (FIG. 6D). The heater substrate in the state shown in FIG. 6D is schematically shown as a perspective view in FIG. 7. The $HfB_2$ layer 603 exposed at the recess 605 acts as a heat-generating site when electricity is passed to the electrode formed by the Al layer 604. The Al layer is a lower wiring in the matrix wiring.

Figure 6E:
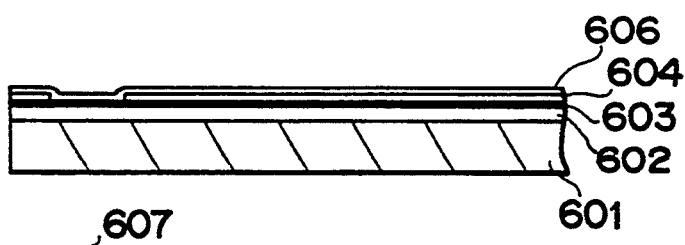
Figure 6F:
Figure 6G:

Then, a $SiO_2$ thin film 606 as a protective layer as well as an insulating layer is formed on the heater substrate shown in FIG. 6D (or FIG. 7) (FIG. 6E). Then, a Ta layer 607 as a protective layer formed at the site corresponding to the recess 605 (FIG. 6F), and the $SiO_2$ film 606 is locally etched to form a contact hole 608 through the $SiO_2$ film 606 (FIG. 6G). Etching of the $SiO_2$ film 606 is carried out under the same conditions as given in Example 1.

Figure 6H:
Figure 8:
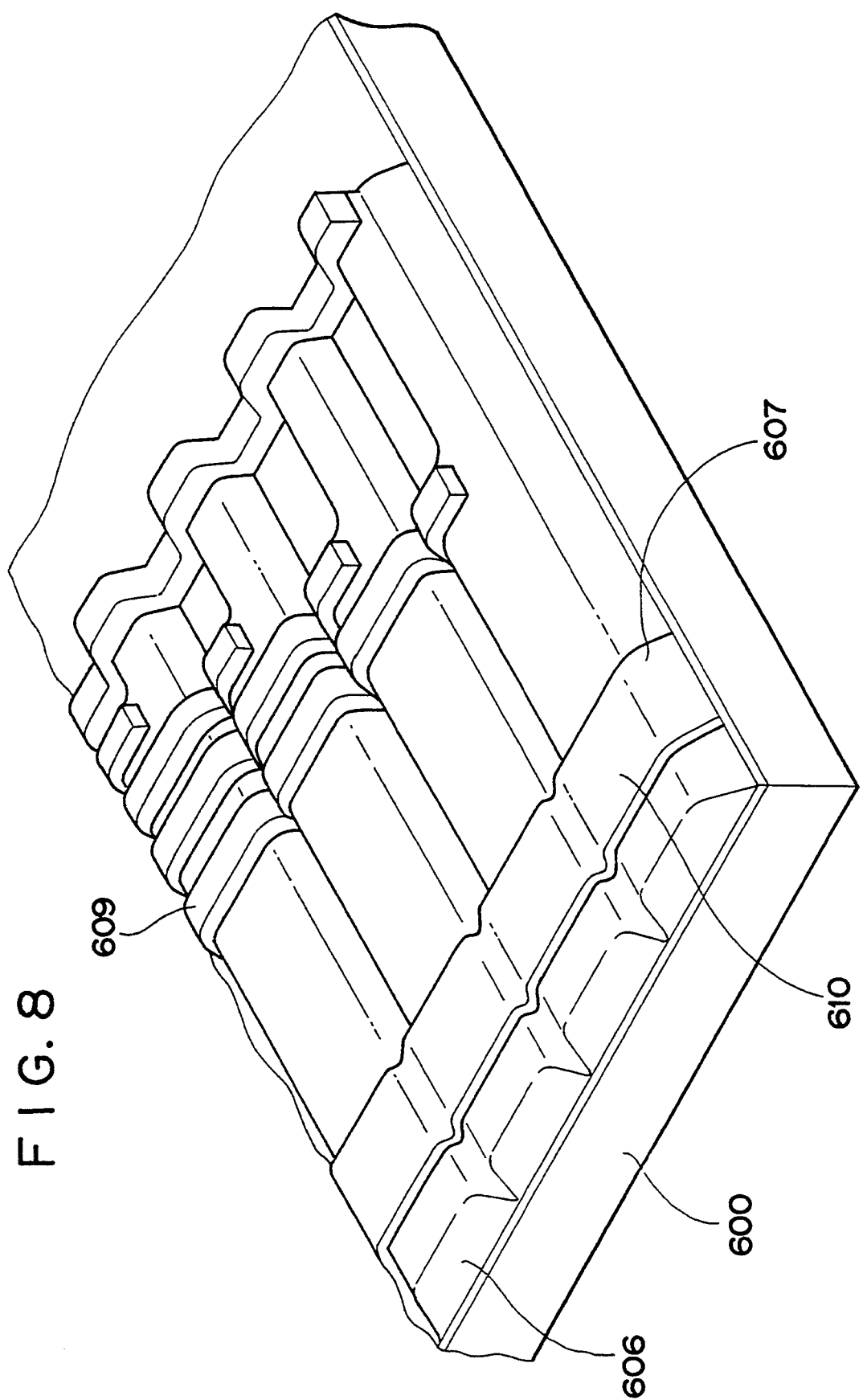
FIG. 8 is a schematic perspective view of a heater substrate.

After the formation of the contact hole 608, Al as a conductive metallic material is formed as an upper wiring that constitutes the matrix wiring and then patterned in a desired shape to form an Al wiring 69 (FIG. 6H). Then, it is preferable to provide an organic resin such as polyimide, etc. as a protective layer thereon, if required. In that case, it is desirable to provide the organic resin at other sites than the heat-working surface 610 to improve a thermal response. The schematic perspective view of the completed heater substrate shown in FIG. 6H is given in FIG. 8. As shown in FIG. 8, the individual heaters are in the matrix wiring.

Figure 6I:
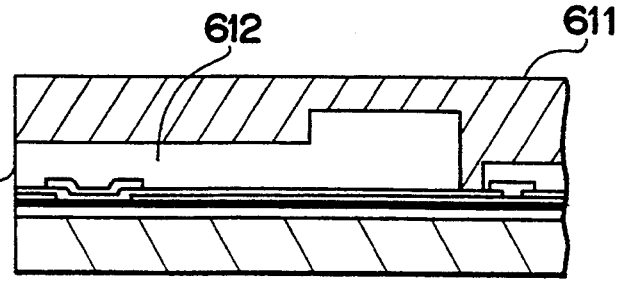
Figure 9:
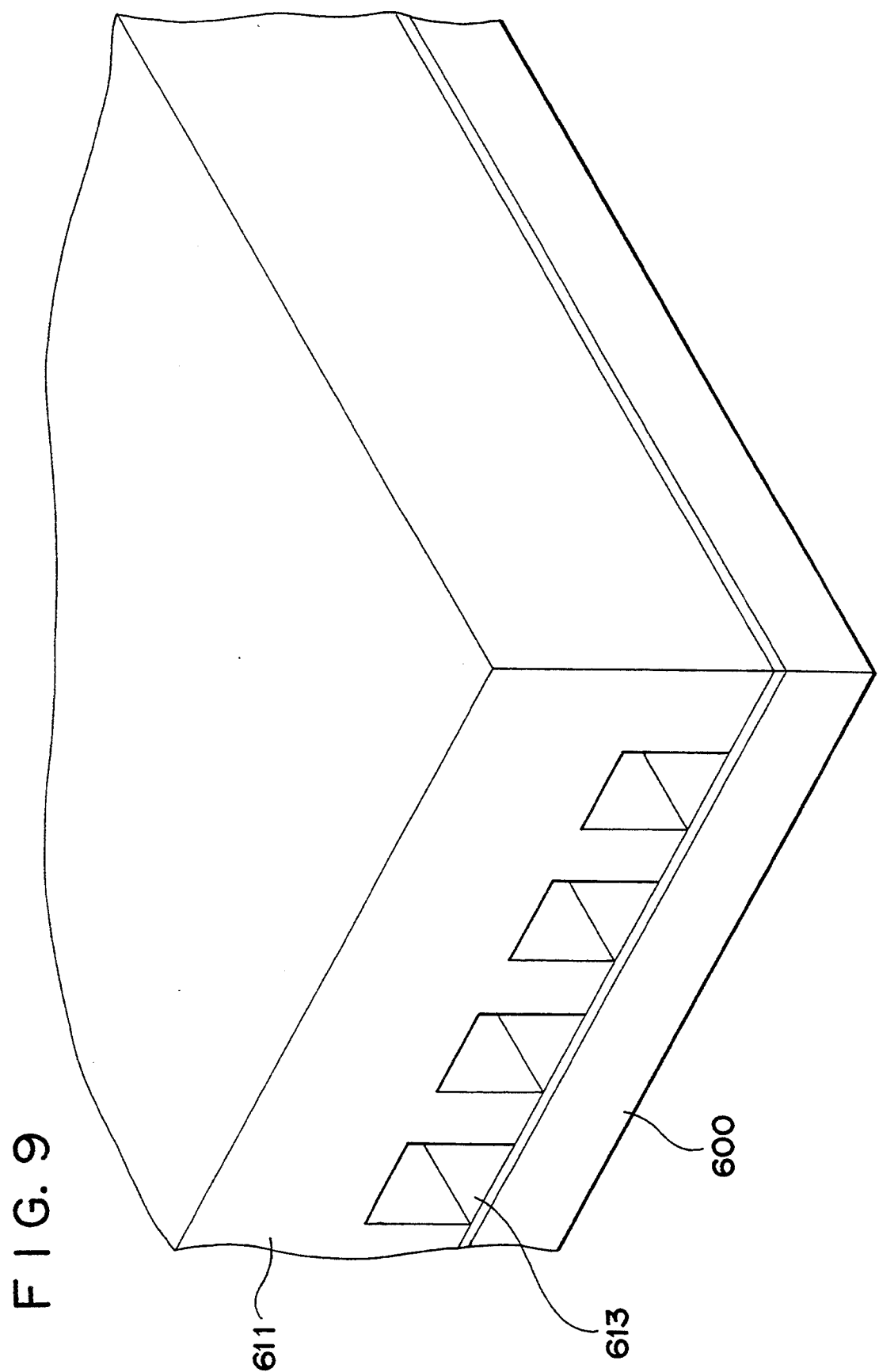
FIG. 9 is a schematic perspective view of an ink jet head.

Then, a cover member 611 is provided on heater substrate, and a liquid path 612 and a discharge opening 613 are formed to complete an ink jet lead (FIG. 6I). A schematic perspective view of the completed head is shown in FIG. 9.

When recording is carried out with the thus prepared ink jet head, it is found that thermal fluctuations between the individual heater are much less and firming of bubble generation in a liquid is very stable. Durability of the head prepared in this Example is such that very stable characteristics can be maintained for a long time without any peeling of the films.

EXAMPLE 6

Etching is carried out in the same manner as in Example 1, except that the $SiO_2$ film is replaced with a $Si_3N_4$ film, and it is found that etching can be carried out with high uniformity without any deposition of reaction products of Al, as in Example 1.

EXAMPLE 7

A heater substrate is prepared in the same manner as in Example 5, except that the $SiO_2$ layer 602 is replaced with a $Si_3N_4$ layer, and an ink met head is prepared in the same manner as in Example 5, using the thus prepared heater substrate. It is found that stable injection can be maintained for a long time with much less fluctuations between the individual heaters, as in Example 5.

EXAMPLE 8

Etching is carried out in the same manner as in Example 1, except that the $SiO_2$ film used in Example 1 is replaced with a SiC film, and it is found-that etching can be carried out with high uniformity without any deposition of reaction products of Al, as in Example 1.

What is claimed is:

1. A method for etching a silicon compound film provided on a material comprising aluminum as positioned between an anode electrode and a cathode electrode, which comprises etching the silicon compound film in a gas flow rate ratio of $CHF_3$ gas to $C_2F_6$ gas ranging from 1:1 to 6:1 under an etching pressure of 40 to 120 Pa and applying from about 150 to 500 W of power between said anode electrode and said cathode electrode.

2. A method according to claim 1, wherein the distance between the anode electrode and the cathode electrode is from 4.0–7.0 mm.

3. A method according to claim 1, wherein the silicon compound film contains silicon and at least one element selected from oxygen, nitrogen and carbon.

4. A method according to claim 3, wherein the silicon compound film is a film of material selected from silicon oxide, silicon nitride and silicon carbide.

5. A method for etching a silicon compound film positioned between electrodes, which comprises placing an article to be treated between electrodes positioned to be from 4.0–7.0 mm apart in a treating space, the article comprising a material containing at least aluminum and a silicon compound film, introducing $CHF_3$ gas and $C_2F_6$ gas into the treating space in a gas flow rate ratio of the $CHF_3$ gas to the $C_2F_6$ gas ranging from 1:1 to 6:1, etching the silicon compound film under an inner pressure of 40 to 120 Pa in the treating space during the etching and applying from about 150 to 500 W of power between said anode electrode and said cathode electrode.

6. A method according to claim 5, wherein the silicon compound film contains silicon and at least one element selected from oxygen, nitrogen and carbon.

7. A method according to claim 6, wherein the silicon compound film is a film of material selected from silicon oxide, silicon nitride and silicon carbide.

8. A method according to claim 5, wherein the silicon compound film is provided on the material containing Al.

9. A method according to claim 5, wherein the material containing Al is Al metal or an Al alloy.

10. A method according to claim 5, wherein at least one of an inert gas and $H_2$ gas is further introduced into the treating space.

11. A method according to claim 10, wherein the inert gas is He gas.

12. A method according to claim 10, wherein said at least one of the inert gas and $H_2$ gas is a gas for diluting at least one of the $CHF_3$ gas and the $C_2F_6$ gas.

13. A method according to claim 5, wherein the interelectrode distance is 4.0 to 6.0 mm.

14. A method according to claim 5, wherein the gas flow rate ratio is 3 to 6.

15. A method according to claim 5, wherein the pressure is 40 to 100 Pa.

16. A method for forming a product, which comprises placing an article to be treated between electrodes as positioned at an interelectrode distance of 4.0–7.0 mm in a treating space, the article to be treated comprising a material containing at least aluminum and a silicon compound film under a resist patterned in a desired shape, introducing $CHF_3$ gas and $C_2F_6$ gas into a treating space in a gas flow rate ratio of the $CHF_3$ gas to the $C_2F_6$ gas ranging from 1:1 to 6:1, etching the silicon compound film under an inner pressure of 40 to 120 Pa in the treating space during the etching and applying from about 150 to 500 W of power between said anode electrode and said cathode electrode, thereby patterning at least the silicon compound film in the desired shape.

17. A method according to claim 16, further comprising, after patterning of the silicon compound film, providing a conductive layer at a desired position, thereby forming a multilayered wiring.

18. A method according to claim 17, further comprising providing a member for forming a liquid path and a discharge opening, thereby forming an ink jet head.

19. A method according to claim 16, further comprising electrically connecting the material containing aluminum to a heat-generating resistor member, and after the patterning of the silicon compound film, providing a cover member on the article to be treated, thereby forming an ink jet head having a liquid path and a discharge opening through which a liquid is discharged by utilizing heat energy.

* * * * *